(12) United States Patent
Lai et al.

(10) Patent No.: US 8,913,357 B2
(45) Date of Patent: Dec. 16, 2014

(54) ESD PROTECTION CIRCUIT

(75) Inventors: Da-Wei Lai, Singapore (SG); Mahadeva Iyer Natarajan, Clifton Park, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 141 days.

(21) Appl. No.: 13/485,932

(22) Filed: Jun. 1, 2012

(65) Prior Publication Data

US 2013/0321963 A1    Dec. 5, 2013

(51) Int. Cl.
*H02H 9/04*    (2006.01)

(52) U.S. Cl.
USPC .............................. 361/56; 361/91.1; 361/91.5

(58) Field of Classification Search
CPC ............. H02H 9/04; H02H 9/41; H02H 9/42; H02H 3/22; H02H 9/041; H02H 3/243; H02H 9/042
USPC .......................................... 361/56, 91.1, 91.5
See application file for complete search history.

(56) References Cited

U.S. PATENT DOCUMENTS

| | | | | |
|---|---|---|---|---|
| 3,070,743 A | * | 12/1962 | Harper | 323/263 |
| 4,701,635 A | * | 10/1987 | Kawazoe et al. | 326/84 |
| 5,877,927 A | * | 3/1999 | Parat et al. | 361/56 |
| 5,940,258 A | * | 8/1999 | Duvvury | 361/56 |
| 6,275,089 B1 | * | 8/2001 | Song et al. | 327/314 |
| 6,445,233 B1 | * | 9/2002 | Pinai et al. | 327/159 |
| 6,639,284 B1 | * | 10/2003 | Chatterjee et al. | 257/355 |
| 6,919,603 B2 | * | 7/2005 | Brodsky et al. | 257/361 |
| 7,098,717 B2 | * | 8/2006 | Watt | 327/313 |
| 8,049,250 B2 | * | 11/2011 | Song et al. | 257/173 |
| 8,400,742 B2 | * | 3/2013 | Lai et al. | 361/56 |

* cited by examiner

*Primary Examiner* — Zeev V Kitov
(74) *Attorney, Agent, or Firm* — Horizon IP Pte. Ltd.

(57) ABSTRACT

An ESD circuit is disclosed. The ESD circuit includes a pad and a ground and a sensing element coupled between the pad and ground for sensing an ESD current. The sensing element generates an active sense output signal when an ESD current is sensed and an inactive sense output signal when no ESD current is sensed. The ESD circuit also includes a bypass element comprising a bi-polar junction transistor. The bypass element is coupled in parallel to the sensing element between the pad and ground. The active sense output signal causes the bypass element to be activated to provide a current path between the pad and ground.

16 Claims, 9 Drawing Sheets

US 8,913,357 B2

ESD PROTECTION CIRCUIT

BACKGROUND

Electrostatic discharge (ESD) generated from static electricity is usually characterized by fast transient high voltage discharge. An ESD event can occur in electrical and electronic circuits, such as an integrated circuit (IC). It can create sufficiently high voltage to cause destructive breakdown of devices connected to, for example, the inputs and/or outputs of the integrated circuits.

In the case of bi-directional I/O drivers, which have mixed voltage signals, conventional ESD protection includes dual diode or MOS based circuits. Such conventional ESD protection results in leakage currents when the mixed voltage signal is above $V_{dd}$ or below $V_{ss}$.

An alternative approach is a silicon controlled rectifier (SCR) ESD protection circuit. However, SCR ESD protection circuits are subject to latch up during normal IC operation. Latch up affects the operation of the IC, rendering it defective.

Therefore, it is desirable to have an ESD protection circuit which can be quickly triggered to avoid damaging internal circuits and immune to latch up during normal operation.

SUMMARY

An ESD circuit is disclosed. The ESD circuit includes a pad and a ground and a sensing element coupled between the pad and ground for sensing an ESD current. The sensing element generates an active sense output signal when an ESD current is sensed and an inactive sense output signal when no ESD current is sensed. The ESD circuit also includes a bypass element including a bi-polar junction transistor. The bypass element is coupled in parallel to the sensing element between the pad and ground. The active sense output signal causes the bypass element to be activated to provide a current path between the pad and ground.

In another embodiment, an ESD circuit is presented. The ESD circuit includes a pad and a ground and a sensing element coupled between the pad and ground. The ESD circuit also includes a bypass element including a PNP transistor. The bypass element is coupled in parallel to the sensing element between the pad and ground. The ESD circuit further includes a control element having a control input coupled to the sensing element and a control output coupled to the bypass element. The control element activates the bypass element during an ESD event to provide a current path between the pad and ground through the bypass element.

In yet another embodiment, a method of forming a device is disclosed. The method includes providing a substrate prepared with a bypass element and a sensing element. The bypass element comprises a bi-polar junction transistor. The method also includes coupling an emitter of the bypass element to a pad and a collector of the bypass element to ground. A first terminal of the sensing element is coupled to the pad and a second sensing terminal is coupled to ground. The sensing element generates an active sense output signal when an ESD current is sensed and an inactive sense output signal when no ESD current is sensed. The active sense output signal causes the bypass element to be activated to provide a current path between the pad and ground.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. Some embodiments relate to devices having bi-directional input/output (I/O) pads. Such devices, for example, include xDSL devices. The devices or ICs can be incorporated into or used with, for example, electronic products, such as modems. Other types of devices or products may also be useful.

Figure 1A:
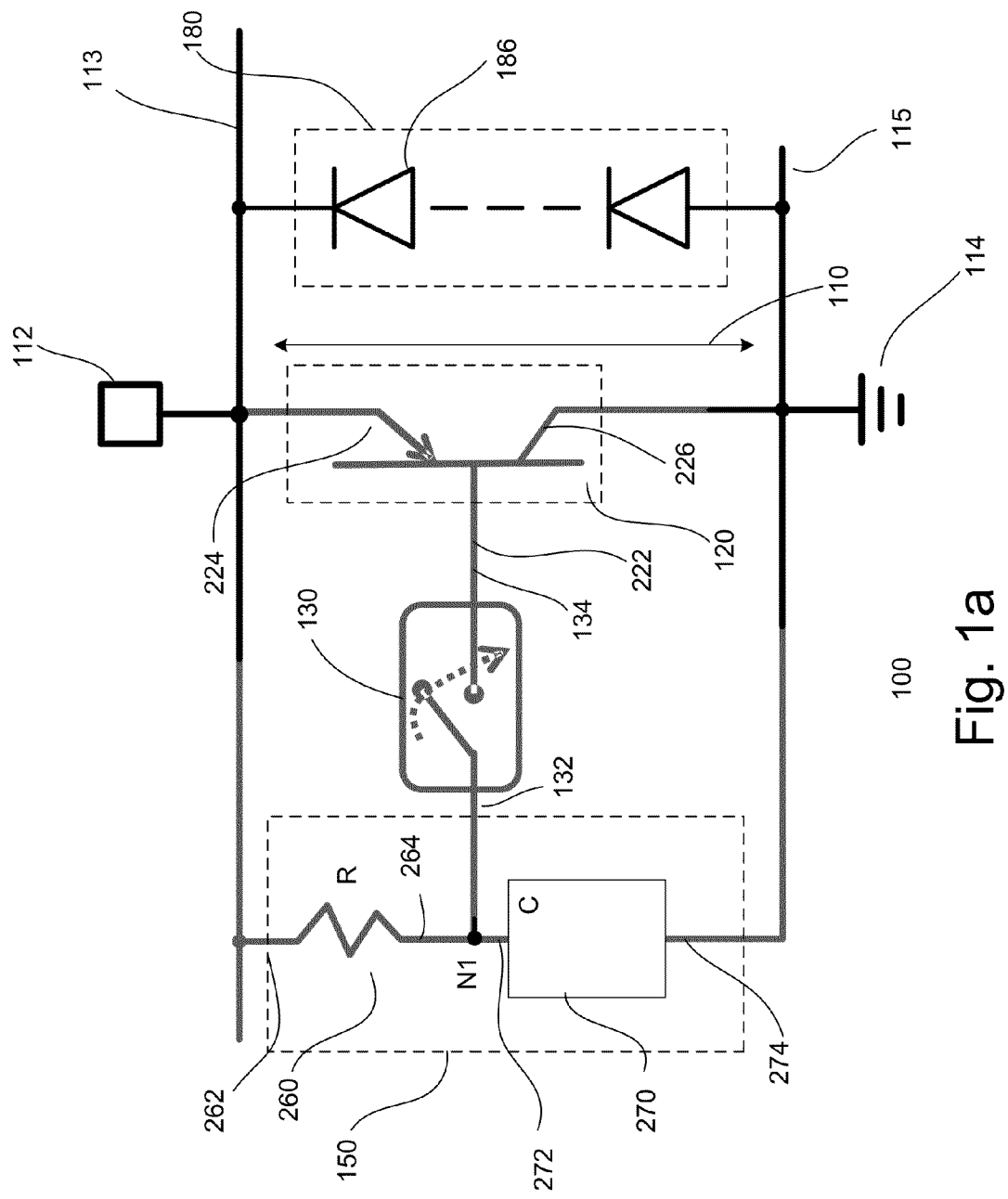
FIG. 1a shows an embodiment of an ESD circuit.

FIG. 1a shows an embodiment of an ESD circuit 100. In one embodiment, the ESD circuit is a bi-directional ESD circuit. The ESD circuit may be incorporated into a semiconductor device of IC. The ESD circuit, for example, includes a pad rail 113 and ground rail 115. A pad 112 is coupled to the pad rail. The pad, for example, is an I/O pad of the IC. In other embodiments, the pad may be a high power pad, such as $V_{dd}$. Other types of pads of an IC may also be useful. As for the ground rail, it serves as the ground or $V_{ss}$ of the IC. The ground rail may be coupled to a ground pad (not shown).

An internal circuit (not shown) may be coupled to the pad. The internal circuit, for example, is an I/O circuit. The internal circuit, for example, may be an inverter. Other types of circuits, such as NAND or NOR circuits may also be useful. In some embodiments, the internal circuit may be a mixed-voltage I/O buffer. For example, the I/O pad may provide mixed voltage I/O signals, which may be higher than, for example, $V_{dd}$ (over-$V_{dd}$) and lower than $V_{ss}$ (under-$V_{ss}$).

The ESD circuit includes a sensing element 150, a control element 130 and ESD current bypass element 120. In one embodiment, the bypass element and sensing element are coupled in parallel between the pad and the ground. The control element is coupled between the sensing and bypass elements. In one embodiment, a control input 132 of the control element is coupled to an output (e.g., at node N1) of the sensing element while an output 134 of the control element is coupled to an input 222 of the bypass element.

In one embodiment, a clamping circuit 180 is disposed between the pad and ground. The clamping circuit, for example, provides an ESD bypass path under ESD testing from the pad to ground with negative zapping.

The ESD circuit may operate in a first or a second operating mode. The first operating mode, for example, is a normal operating mode while the second mode is an ESD mode. In the normal operating mode, the bypass element is inactive, preventing a current path between the pad and ground. On the other hand, the bypass element is active in the ESD mode. This provides a current path between the pad and ground, allowing a transmission line pulse (TLP) current to dissipate. For example, the TLP current dissipates through the bulk substrate of the device, preventing damage to the internal circuit or other circuits coupled to the pad. The current path, in one embodiment, is a bi-directional current path, as indicated by arrow 110. For example, TLP current may flow from the pad to ground or ground to the pad.

In one embodiment, the sensing element senses the presence or absence of a TLP current. If no TLP current is sensed, the ESD circuit operates in the normal mode. In the normal mode, the sensing element generates a first sensing output signal. The first sensing output signal causes the control element to generate a first control output signal which renders the bypass element inactive. If TLP current is sensed, the ESD circuit operates in the ESD mode. In the ESD mode, the sensing element generates a second sensing output signal. The second sensing output signal causes the control element to generate a second control output signal which renders the bypass element active, providing a current path between the pad and ground.

In one embodiment, the bypass element is a bipolar junction transistor (BJT). In one embodiment, the bypass element is a lateral PNP transistor. The PNP transistor includes a base terminal 222, an emitter terminal 224 and a collector terminal 226. The emitter terminal is coupled to the pad and the collector terminal is coupled to ground.

As for the sensing element, it includes an RC circuit. The RC circuit includes a resistor 260 and a capacitor 270 coupled in series. The resistor, for example, may be a polysilicon resistor. In one embodiment, the resistor is an unsilicided polysilicon resistor. The RC circuit and the PNP transistor are coupled in parallel between pad 112 and ground 114. For example, a first resistor terminal 262 is coupled to the pad and a second capacitor terminal 274 is coupled to ground. A second resistor terminal 264 is coupled to a first capacitor terminal 272. The second resistor terminal and first capacitor terminal form a common node N1 in the sensing element. The common node N1 serves as a sensing output terminal of the sensing element.

The control element, in one embodiment, is a switch circuit having a control input terminal 132 and a control output terminal 134. The control input terminal is coupled to the sensing output terminal N1 and the control output terminal is coupled to the base terminal of the transistor.

The clamping circuit, in one embodiment, includes at least one diode 186. The diode provides an ESD bypass path under negative ESD zapping from I/O pad to ground. In one embodiment, the diode is a reverse biased diode. For example, a cathode of the diode is coupled to the pad and an anode of the diode is coupled to ground. In other embodiments, a plurality of diodes are coupled in series, with an anode of a diode coupled to the cathode of another diode. The number of diodes used depends on operational voltage. For example, the number of diodes should be sufficient to avoid leakage during normal operation. The turn-on voltage of a diode may be about 0.7V. In the case where operational voltage is about 1.8V, 3 diodes should be used to prevent leakage.

The sensing element which may include an RC circuit being designed with an appropriate RC time constant ($\tau$). $\tau$ is equal to the resistance of the resistor multiplied by the capacitance of the capacitor. In one embodiment, $\tau$ is selected to sufficiently sense the ESD current. The RC time constant, for example, may be about 1 to 2 $\mu$s. Other values of $\tau$ may also be useful.

When the ESD circuit is in the normal mode of operation, the sensing circuit generates an inactive sense signal at the sensing output terminal. For example, when no ESD current is sensed, the sensing circuit generates an inactive sense signal. On the other hand, in the ESD mode, the sensing circuit generates an active sense signal at the sensing output terminal. For example, the sensing circuit generates an active sense signal. In one embodiment, the active sense signal is a logic 0 signal and an inactive sense signal is a logic 1 signal. Other configurations of sense signals are also useful.

In one embodiment, in the normal mode, the capacitor is deactivated. This is because in the normal mode, the timing is in the ms range. Since $\tau$ of the sensing circuit is in the $\mu$s range, the capacitor is inactive. This results in the signal at the pad to be at N1, which is the inactive sense signal.

The inactive sense signal causes the switch to be opened. An open switch produces a first control output signal which is floated. Providing a floated signal at the base terminal switches the transistor off, preventing current flowing between the emitter and collector. As such, no current path is formed between the pad and ground, allowing the device to operate normally. In some cases, there may be current leakage through the transistor, for example, just as it is in the breakdown mode.

In the ESD mode, the sensing element produces an active sense signal at the sense output terminal N1. The TLP current causes the capacitor to be active in the ESD mode. For example, the TLP current at the pad passes through the resistor and capacitor to ground. This results in a logic 0 signal (active sense signal) at N1. The active sense signal causes the switch to be closed, producing a second control output signal which is equal to logic 0 at the base of the transistor. This switches the transistor on, creating a current path between the pad and ground, as indicated by arrow 110. As such, the TLP current flows between the pad to ground. In the case of a positive ESD zap, TLP current flows from the pad to ground. On the other hand, TLP current flows from ground to the pad during a negative ESD zap.

As described in one embodiment, the signal for switching the bypass element on is a logic 0 signal. The use of a logic 0 signal to switch on the transistor reduces the trigger voltage ($V_{t1}$) of the bypass element. This ensures that the bypass element is activated to protect the I/O driver and other components of the IC during an ESD event.

Figure 1B:
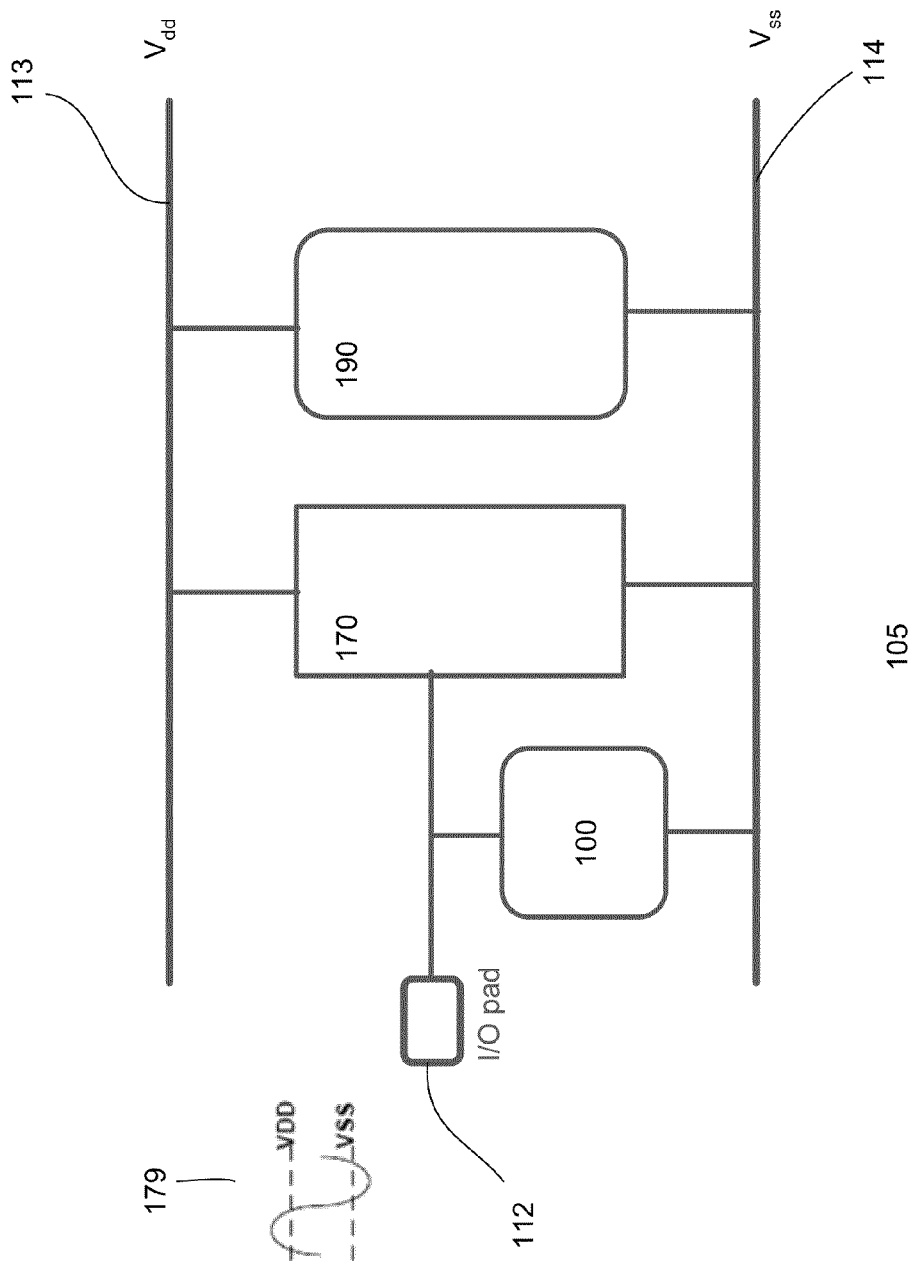
FIG. 1b shows an application of an embodiment of an ESD circuit.

FIG. 1b shows an embodiment of a bi-directional driver module 105. The bi-directional driver module includes an ESD circuit 100. In one embodiment, the ESD circuit is an ESD circuit as described in FIG. 1a. As such, common elements may not be described or described in detail. For example, the ESD circuit includes sensing, control, bypass, and clamping elements. The sensing, bypass and clamping elements of ESD circuit are disposed in parallel and between an I/O pad 112 and ground 114, such as $V_{ss}$.

The bi-directional driver module includes a bi-directional driver circuit 170 disposed between a high power source 113 and a low power source 114, such as $V_{dd}$ and $V_{ss}$. The bi-directional driver, for example, may be any type of bi-directional driver. The bi-directional driver is coupled to the I/O pad. The I/O pad, for example, may be provided with a mixed-voltage signal 179 for the bi-directional driver circuit.

In one embodiment, a power rail clamping circuit 190 is disposed between $V_{dd}$ and $V_{ss}$. When an ESD event occurs at the pad, the ESD circuit provides a current path between the pad and ground to dissipate the TLP current. When an ESD event occurs at the power rail, the clamping circuit provides an ESD bypass path between $V_{dd}$ and $V_{ss}$.

Figure 2:
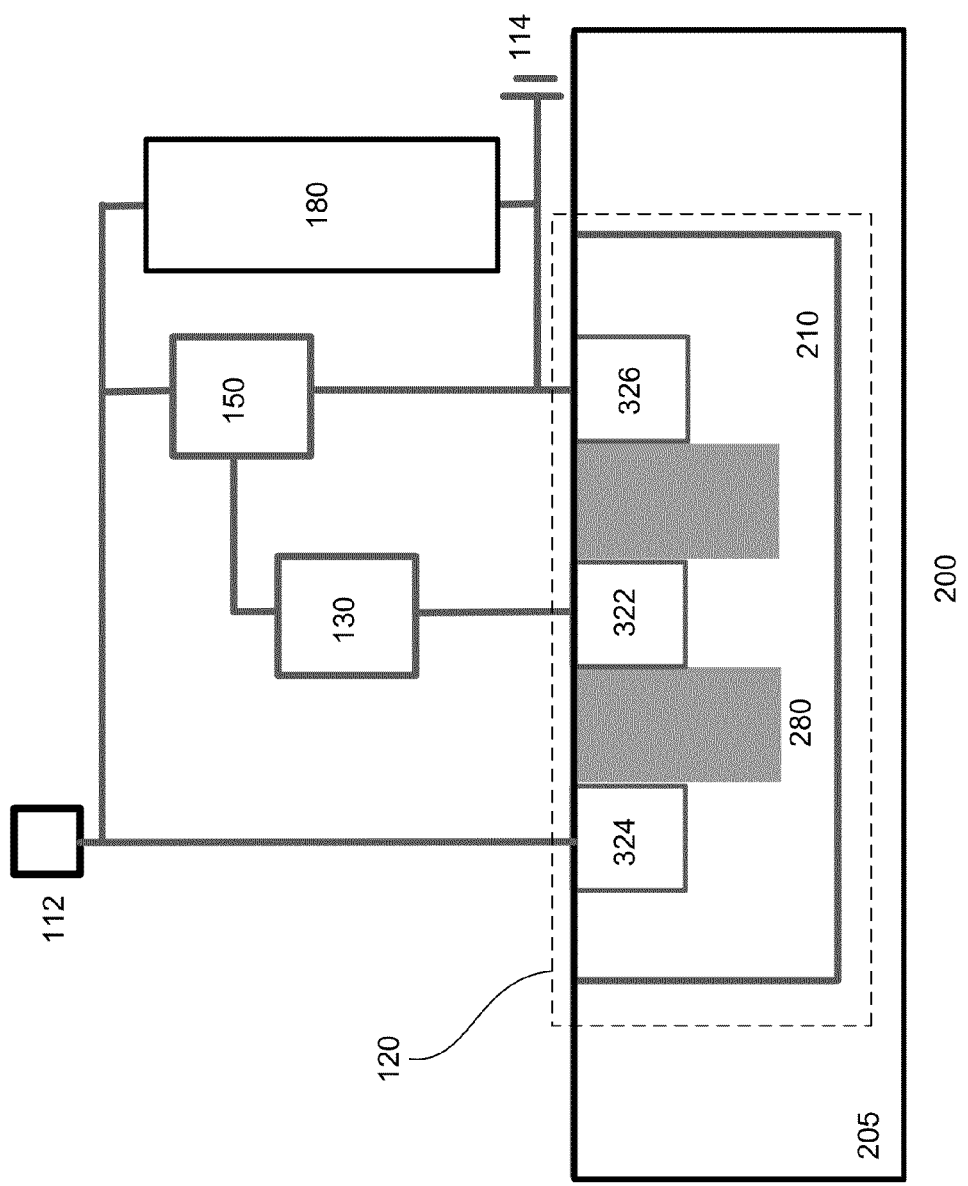
FIG. 2 shows a simplified cross-sectional diagram of an embodiment of an ESD circuit.

FIG. 2 shows a simplified cross-sectional view of an embodiment of an ESD circuit 200. The ESD circuit includes common elements as that described in FIGS. 1a-b. As such, common elements may not be described or described in detail. The ESD circuit includes a substrate 205. The substrate, for example, may be a semiconductor substrate such as a silicon substrate. In one embodiment, the substrate is a lightly doped p-type silicon substrate. Providing other types of substrates, as well as intrinsic or doped with other types of dopants or dopant concentrations may also be useful.

The substrate includes a transistor region in a bypass element 120 of the ESD circuit. In one embodiment, the ESD region is provided with a doped well 210. The doped well, for example, is an intermediately doped well of a second polarity type. In one embodiment, the second polarity type is n-type while a first polarity type is p-type. Providing a second polarity type doped well of other dopant concentrations may also be useful.

In one embodiment, the transistor region includes first, second and third heavily doped regions 322, 324 and 326. In one embodiment, the first doped region is a second polarity type doped region while the second and third doped regions are first polarity type doped regions. The doped regions serve as different terminals of a PNP BJT transistor of the bypass element. For example, the first doped region serves as a base terminal, the second doped region serves as an emitter terminal and the third doped region serves as a collector terminal.

In one embodiment, isolation regions 280 are provided in the transistor regions. The isolation regions, for example, are shallow trench isolation regions which include dielectric materials filling trenches in the substrate. Other types of isolation regions may also be useful. The isolation regions, as shown, separate the terminals of the transistors. The depth of the isolation regions should be deeper than the terminals of the transistor and shallower than the depth of the doped well 210. An isolation region (not shown) may also be provided to isolate the transistor region from other regions.

The collector terminal is coupled to ground 114 while the emitter terminal is coupled to a pad 112. A sensing element 150 includes a first sense terminal coupled to the pad and a second sense terminal coupled to the ground and the collector terminal. A control element 130 includes a control input terminal coupled to the base terminal and a control output terminal coupled to the sense output terminal. A clamping element 180 is coupled to ground and the pad. The ESD circuit operates similarly as described in FIG. 1a.

Figure 3A:
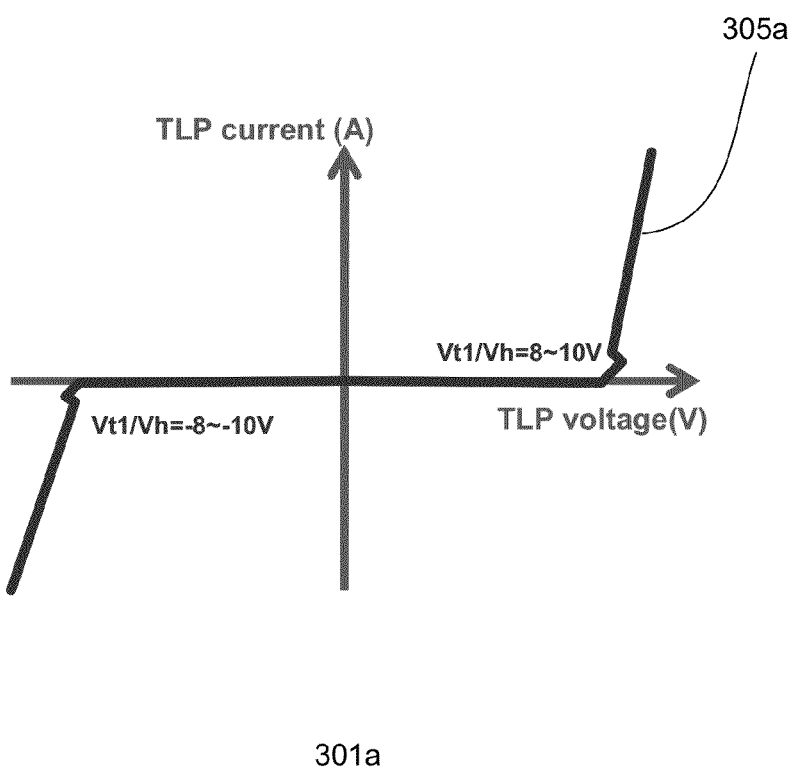
FIGS. 3a-b show V/C curves of an embodiment of an ESD circuit.
Figure 3B:
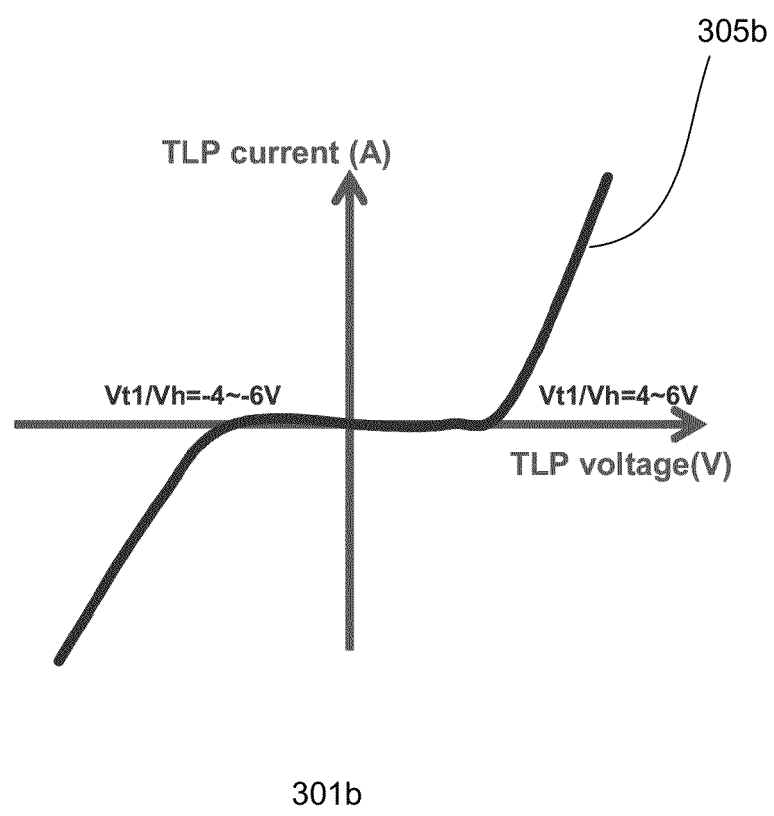

FIGS. 3a-b show V-C plots 301a-b of an embodiment of an ESD circuit in the normal and ESD mode, respectively. In the normal mode, as shown in FIG. 3a, when the PNP transistor is in the off mode, curve 305a indicates that the trigger voltage ($V_{t1}$) and holding voltage ($V_h$) of the transistor may be about ±8-10 V. In the ESD mode, when the PNP transistor is in the on mode, curve 305b indicates that the $V_{t1}$ and $V_h$ of the transistor is about ±4-6 V.

As shown, $V_{t1}$ and $V_h$ are lower in the ESD mode than in the normal mode. This is due to the sensing and control circuit which switch the transistor on. This avoids the need for the transistor to achieve the junction breakdown voltage. The lower $V_{t1}$ in the ESD mode is achieved with the sensing circuit. The lower $V_{t1}$ enables quick activation of the bypass circuit, achieving high protection performance to reduce or avoid damage to the internal circuits. Additionally, $V_h$ is greater than the operating voltage of the device in the normal mode, preventing latch up from occurring.

Figure 4A:
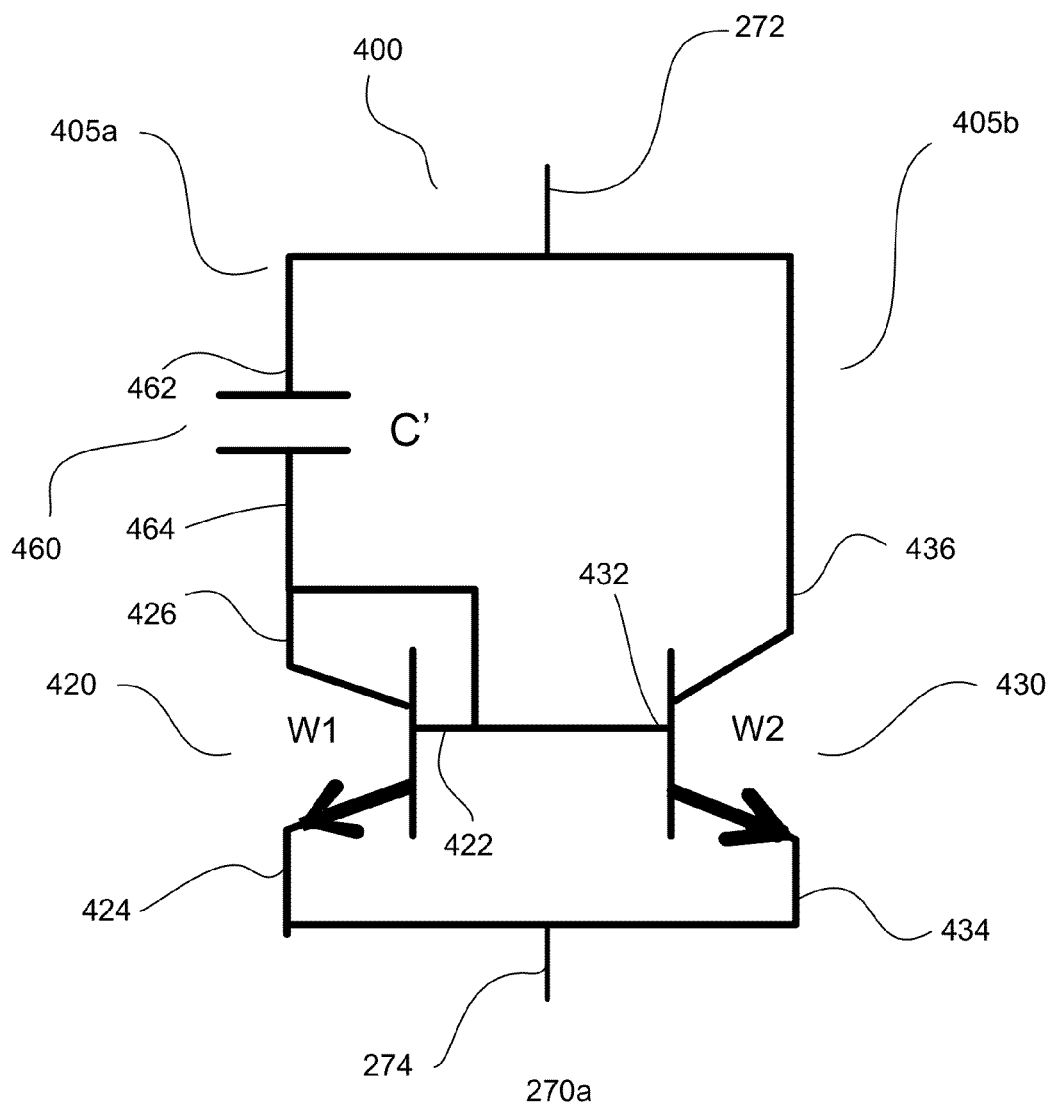
FIGS. 4a-b show embodiments of capacitor circuits.
Figure 4B:
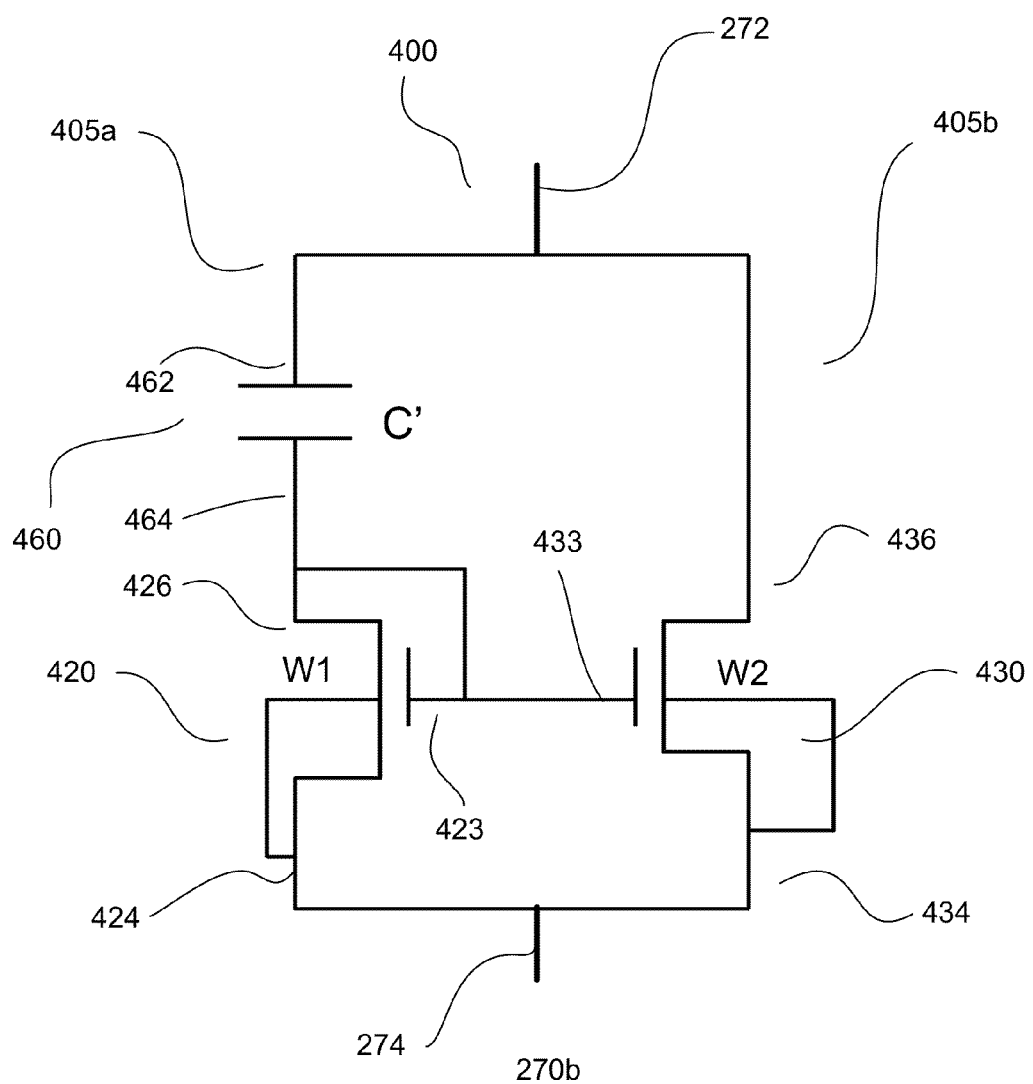

FIGS. 4a-b show some embodiments of capacitors 270a-b employed by the ESD circuit. Referring to FIGS. 4a-b, the capacitor is implemented as a current mirror circuit 400. The current mirror circuit includes first and second parallel current paths 405a-b between first and second current mirror terminals 272 and 274. The first terminal, for example, is coupled to the resistor of the RC circuit while the second terminal is coupled to ground. The first current path includes a capacitor 460 (C') and a first transistor 420 coupled in series. For example, a first capacitor terminal 462 is coupled to the first terminal of the current mirror circuit and a second capacitor terminal 464 is coupled to a third terminal 426 of the first transistor. A second terminal 424 of the transistor is coupled to ground. The second current path includes a second transistor 430. A third terminal 436 of the second transistor is coupled to the first current mirror terminal and a second terminal 434 of the second transistor is coupled to the second current mirror terminal. The first terminals 422 and 432 of the transistors are commonly coupled. The third terminal of the first transistor is also commonly coupled to the first terminals of the transistors. The first transistor has a width W1 and the second transistor has a width W2.

The capacitance C of the current mirror is determined by the following:

$$C=C'\times(1+M),$$

where M=W2/W1.
By tuning the width of the transistors, the desired capacitance of the RC circuit can be obtained. Furthermore, the multiplicative effect of the capacitances of the current mirror enables area savings for a given time constant τ. For example, a smaller resistor may be used with a larger capacitance to achieve the same τ. The larger capacitance can be achieved using less area than with normal capacitors. This and the use of a smaller resistor lead to area reduction for the ESD circuit.

The current mirror may be implemented with BJTs, as shown in FIG. 4a. In one embodiment, the transistors are NPN transistors. Other types of transistors may also be useful. The first transistor includes a base terminal 422, an emitter terminal 424 and a collector terminal 426. The collector terminal is coupled to the capacitor C' while the emitter terminal is coupled to the second current mirror terminal. The second transistor includes a base terminal 432, an emitter terminal 434 and a collector terminal 436. The collector terminal is coupled to the first current mirror terminal and the emitter terminal is coupled to the second current mirror terminal. The base terminals of the transistors are commonly coupled to the collector terminal of the first transistor. The capacitor C', for example, may be a MOS capacitor. Other types of capacitors for C' may also be useful.

In another embodiment, the current mirror is implemented with metal oxide semiconductor (MOS) transistors, as shown in FIG. 4b. In one embodiment, the transistors are n-type transistors. Other types of transistors may also be useful. The first transistor 420 includes a gate terminal 423, a first source/drain (S/D) terminal 424 and a second S/D terminal 426. The second S/D terminal is coupled to the capacitor C' while the first S/D terminal is coupled to the second current mirror terminal. The second transistor 430 includes a gate terminal 433, a first S/D terminal 434 and a second S/D terminal 436. The second S/D terminal is coupled to the first current mirror terminal and the first S/D terminal is coupled to the second current mirror terminal. The gate terminals of the transistors are commonly coupled to the second S/D terminal of the first transistor.

Figure 5:
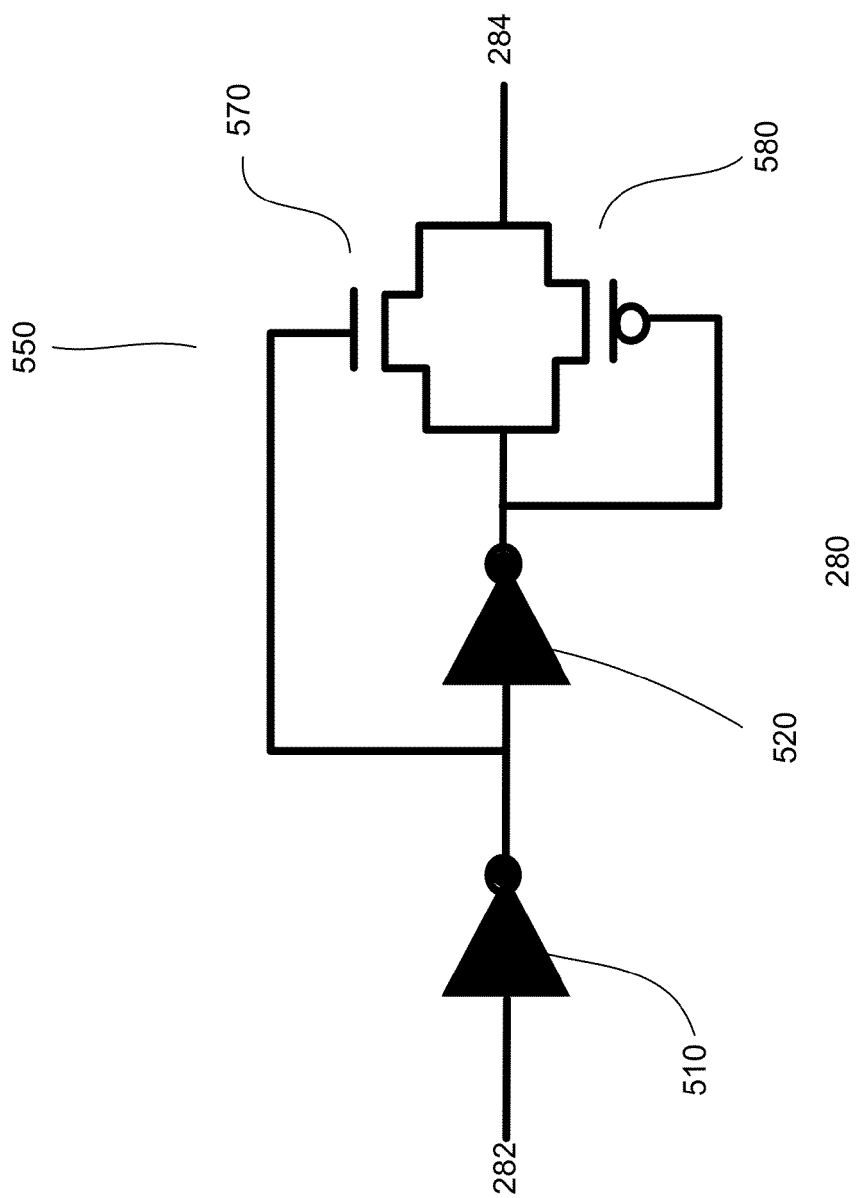
FIG. 5 shows an embodiment of a control circuit.

FIG. 5 shows an embodiment of a control element 280. As shown, the control element includes an input terminal 282 and an output terminal 284. The input terminal is coupled to the sensing element and the output terminal is coupled to the bypass element. For example, the input terminal is coupled to the node N1 between the resistor and capacitor while the output terminal is coupled to the base terminal of a PNP transistor.

In one embodiment, the control element includes a first inverter 510, a second inverter 520 and a switch 550 coupled in series between the control input and control output terminals. The switch, in one embodiment, includes first and second transistors 570 and 580 coupled in parallel. In one embodiment, the first transistor is a n-type MOS transistor and the second transistor is a p-type MOS transistor. The output of the first inverter is coupled to a gate terminal of the first transistor and the output of the second inverter is coupled to a gate terminal of the second transistor.

In operation, when a logic 0 signal is at the control input terminal, the switch is activated, causing the output of the second inverter to be at the control output terminal. If a logic 1 signal is provided at the control input terminal, the switch is deactivated. When the switch is deactivated, the output terminal is decoupled from the output of the second inverter. This causes the control output terminal to be floated.

Figure 6:
FIG. 6 shows a comparison of areas of embodiments of ESD circuits.

FIG. 6 compares area consumption of embodiments of ESD circuits with and without current mirrors to form capacitors. Referring to FIG. 6, first and second ESD function blocks 600*a-b* are shown. The first ESD function block includes a first bypass element sub-block 610*a*, a first capacitor sub-block 620*a* and a first resistor sub-block 630*a*. The first bypass element sub-block includes PNP transistors while the first resistor and capacitor sub-blocks form sensing elements of the ESD circuits. The first capacitor sub-block is implemented using MOS capacitors. As for the second ESD function block, it includes a second bypass element sub-block 610*b*, a second capacitor sub-block 620*b* and a second resistor sub-block 630*b*. The second capacitor sub-block includes current mirrors to form capacitors of the sensing elements.

As previously discussed, current mirrors enable capacitance to be tuned by adjusting the widths of the transistors. Furthermore, the multiplicative effect of the different components of the current mirror enables large capacitances to be achieved with a smaller area. Furthermore, this allows resistors to be smaller. The smaller resistors and larger capacitances of the current mirror lead to a reduction in area 650 of the second ESD function block. For example, a reduction of 40% or more may be achieved using current mirrors and smaller resistors.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. An ESD circuit comprises:
a pad rail and a ground rail;
a pad coupled to the pad rail;
a ground coupled to the ground rail;
a sensing element coupled between the pad and ground rails for sensing an ESD current, the sensing element generates an active sense output signal when an ESD current is sensed and an inactive sense output signal when no ESD current is sensed;

a bypass element comprising a bi-polar junction transistor, the bypass element is coupled in parallel to the sensing element between the pad and ground rails; and a control element having a control input coupled to the sensing element and a control output coupled to the bypass element, the control element comprises first and second inverters and a control switch, wherein the control switch includes first and second transistors coupled in parallel, and an output of the first inverter is coupled to a gate terminal of the first transistor and an output of the second inverter is coupled to a gate terminal of the second transistor, wherein the active sense output signal causes the control element to activate the bypass element to provide a current path between the pad and ground rails and provides ESD protection to a bi-directional circuit.

2. The ESD circuit of claim 1 wherein the active sense output signal causes the control element to activate the bypass element and the inactive sense output signal causes the control element to deactivate the bypass element.

3. The ESD circuit of claim 2 wherein:
the active sense output signal is a logic 1 signal which closes the control switch to provide the active sense output signal to the bypass element for activation; and
the inactive sense output signal is a logic 0 signal which opens the control switch to deactivate the bypass element.

4. The ESD circuit of claim 1 wherein
the sensing element comprises an RC circuit having a resistor and a capacitor coupled in series between the pad and ground rails, wherein
the resistor is coupled to the pad rail,
the capacitor is coupled to ground rail, and
a common terminal of the resistor and the capacitor forms a sense output coupled to the control element.

5. The ESD circuit of claim 4 wherein the capacitor comprises a current mirror.

6. The ESD circuit of claim 4 wherein the RC circuit comprises an RC time constant τ in the range of micro seconds (μs) to sense an ESD event.

7. The ESD circuit of claim 4 wherein τ is about 1 to 2 μs.

8. The ESD circuit of claim 2 wherein the transistor comprises:
an emitter terminal coupled to the pad;
a base coupled the control output terminal of the control element; and
a collector terminal coupled to the ground.

9. The ESD circuit of claim 8 wherein the transistor is a PNP transistor.

10. The ESD circuit of claim 1 comprises a clamping element coupled between the pad and ground rails.

11. The ESD circuit of claim 10 wherein the clamping element comprises at least one diode, wherein a diode anode is coupled to ground and the diode cathode is coupled to the pad.

12. The ESD circuit of claim 1 comprises a hi-directional I/O circuit coupled between the pad and ground rails.

13. An ESD circuit comprises:
a pad rail and a ground rail;
a pad coupled to the pad rail;
a ground coupled to the ground rail;
a sensing element coupled between the pad and ground rails, wherein the sensing element generates an active sense output signal when an ESD current is sensed and an inactive sense output signal when no ESD current is sensed;

a bypass element comprising a PNP transistor, the bypass element is coupled in parallel to the sensing element and between the pad and ground rails; and a control element having a control input coupled to the sensing element and a control output coupled to the bypass element, the control element includes first and second inverters and a control switch, wherein the control switch includes first and second transistors coupled in parallel, and an output of the first inverter is coupled to a gate terminal of the first transistor and an output of the second inverter is coupled to a gate terminal of the second transistor, wherein the active sense output signal causes the control element to activate the bypass element and the inactive sense output signal causes the control element to deactivate the bypass element, the control element activates the bypass element during an ESD event to provide a current path between the pad and ground rails through the bypass element and provides ESD protection to a bi-directional circuit.

14. The ESD circuit in claim 13 comprises a clamping element coupled between the pad and ground rails.

15. The ESD circuit in claim 13 wherein the sensing element comprises an RC circuit having resistor and a capacitor coupled in series between the pad and ground rails, wherein the resistor is coupled to the pad rail, the capacitor is coupled to ground rail, and a common terminal of the resistor and the capacitor forms a sense output coupled to the control element.

16. A method of forming a device comprising:

providing a substrate prepared with a bypass element, a control element and a sensing element, wherein the bypass element comprises a bi-polar junction transistor between a pad rail and a ground rail, and the control element comprises first and second inverters and a control switch, the control switch includes first and second transistors;

coupling a control input of the control element to the sensing element and a control output of the control element to the bypass element;

coupling the first and second transistors of the control switch in parallel, and an output of the first inverter to a gate terminal of the first transistor and an output of the second inverter to a gate terminal of the second transistor;

coupling an emitter of the bypass element to the pad rail and a collector of the bypass element to the ground rail;

coupling a first terminal of the sensing element to the pad rail and a second sensing terminal to the ground rail, wherein the sensing element generates an active sense output signal when an ESD current is sensed and an inactive sense output signal when no ESD current is sensed; and wherein the active sense output signal causes the control element to activate the bypass element to provide a current path between the pad and ground rails and provides ESD protection to a bi-directional circuit.

\* \* \* \* \*